United States Patent
Rose

(10) Patent No.: US 6,190,049 B1
(45) Date of Patent: Feb. 20, 2001

(54) FLUID THRUST BEARING FOR INDICATING INSTRUMENTS AND THE LIKE

(76) Inventor: Vincent H. Rose, P.O. Box 559, Powell, WY (US) 82435

( * ) Notice: Under 35 U.S.C. 154(b), the term of this patent shall be extended for 0 days.

(21) Appl. No.: 09/174,692

(22) Filed: Oct. 19, 1998

(51) Int. Cl.[7] ............ F16C 32/06; G01D 11/02; G01D 11/12; G01R 1/10; G01R 1/14
(52) U.S. Cl. ............ 384/121; 29/898.02; 29/898.041; 73/430; 73/739; 116/300; 324/154 PB
(58) Field of Search ............ 29/898.02, 898.041; 384/107–113, 121–124; 73/430, 866.1, 866.3, 739; 324/154 PB, 174, 258; 116/298, 300, 303, 304

(56) References Cited

U.S. PATENT DOCUMENTS

| | | | |
|---|---|---|---|
| 3,967,580 | * 7/1976 | Yaoita | 116/282 |
| 4,402,335 | 9/1983 | Kemmler | 137/82 |
| 4,492,920 | * 1/1985 | Reenstra | 324/146 |
| 4,710,706 | * 12/1987 | Krupa, Jr. | 324/146 |
| 4,724,601 | * 2/1988 | MacManus et al. | 29/602.1 |
| 4,906,919 | * 3/1990 | Sato et al. | 324/154 R |
| 5,017,862 | * 5/1991 | Brooks | 324/146 |
| 5,038,099 | * 8/1991 | Markow et al. | 324/140 D |
| 5,095,266 | * 3/1992 | Ohike et al. | 324/146 |
| 5,121,109 | * 6/1992 | Murphy, Jr. et al. | 340/688 |
| 5,267,526 | * 12/1993 | Totsuka | 116/291 |
| 5,854,552 | * 12/1998 | Rose | 324/146 |

FOREIGN PATENT DOCUMENTS

2097868 * 11/1982 (GB).

OTHER PUBLICATIONS

Sears, Zemanskey & Young, University Physics (Addison–Wesley Pub. Co.) 7th Ed., Oct. 6, 1997 (para 4 and 5) p. 317.

* cited by examiner

Primary Examiner—Thomas P. Noland
(74) Attorney, Agent, or Firm—Dorsey & Whitney LLP

(57) ABSTRACT

The present invention is a novel fluid thrust bearing system and method for assembling the same. When used in an indicating instrument, the fluid thrust bearing of the present invention reduces the number of necessary parts and simplifies assembly when compared to the prior art. A rotatable element is disposed in a close-fitting cavity so as to define a small gap between the element and the cavity walls, and a fluid is disposed in that gap to the substantial exclusion of air. The fluid damps the rotational movement of the rotatable element. In addition, adhesive forces among the fluid, rotatable element, and cavity walls and cohesive forces within the fluid help maintain the rotatable element in the cavity. Moreover, due to the substantial exclusion of air in the gap, when an axial separating force is applied between the rotatable element and the cavity walls, the resultant tensile stress of the fluid causes a slight stretching of the fluid and creates a negative (vacuum) pressure further preventing the rotatable element from moving axially out of the cavity.

9 Claims, 8 Drawing Sheets

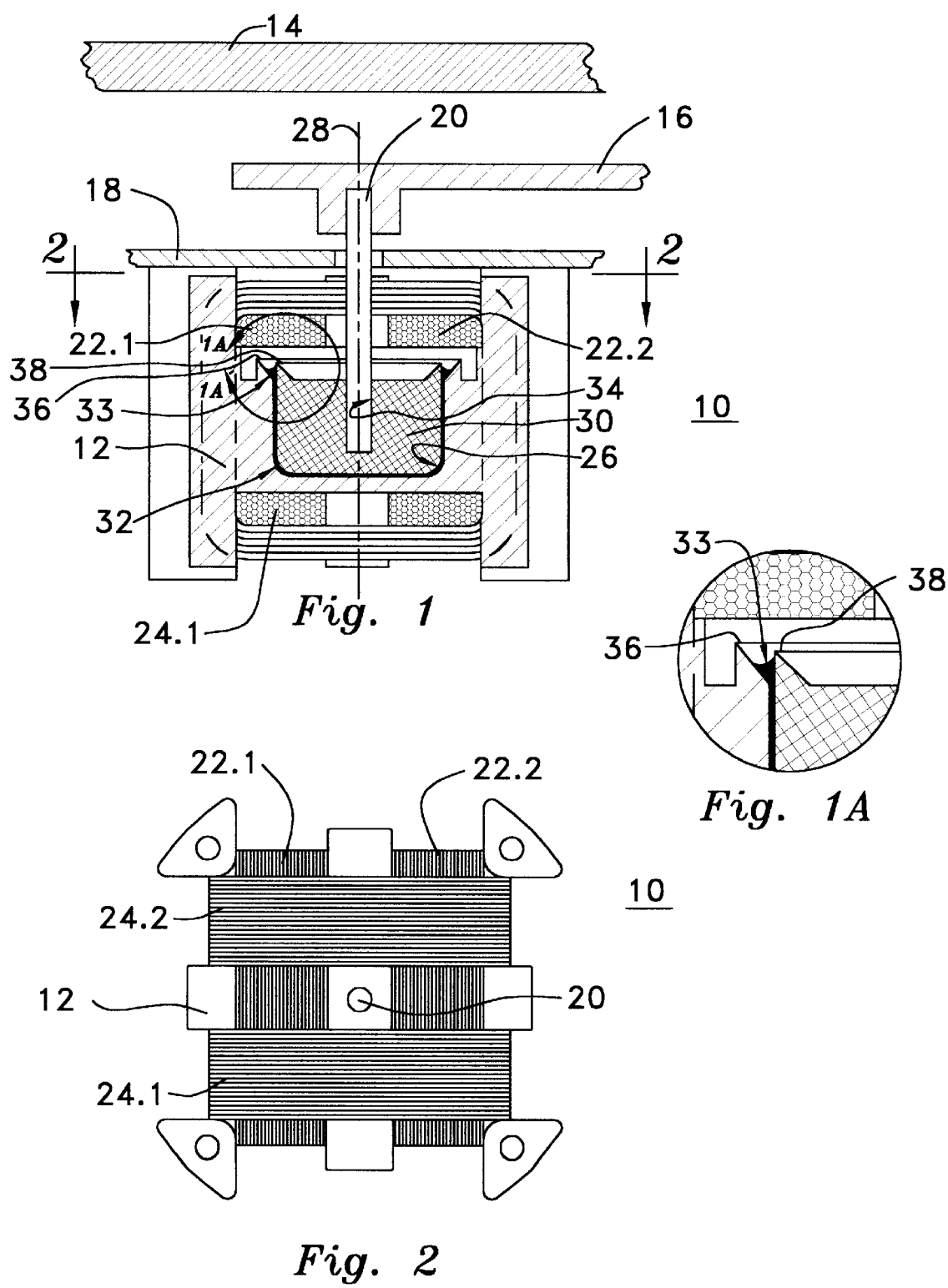

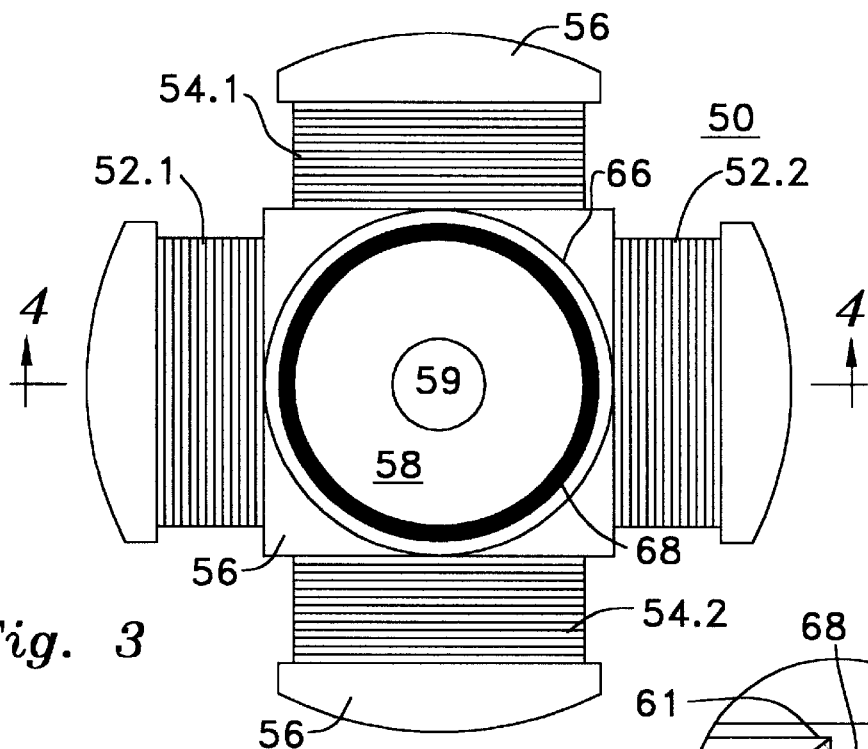
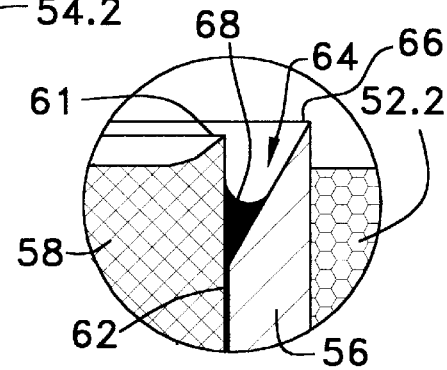
Fig. 4A
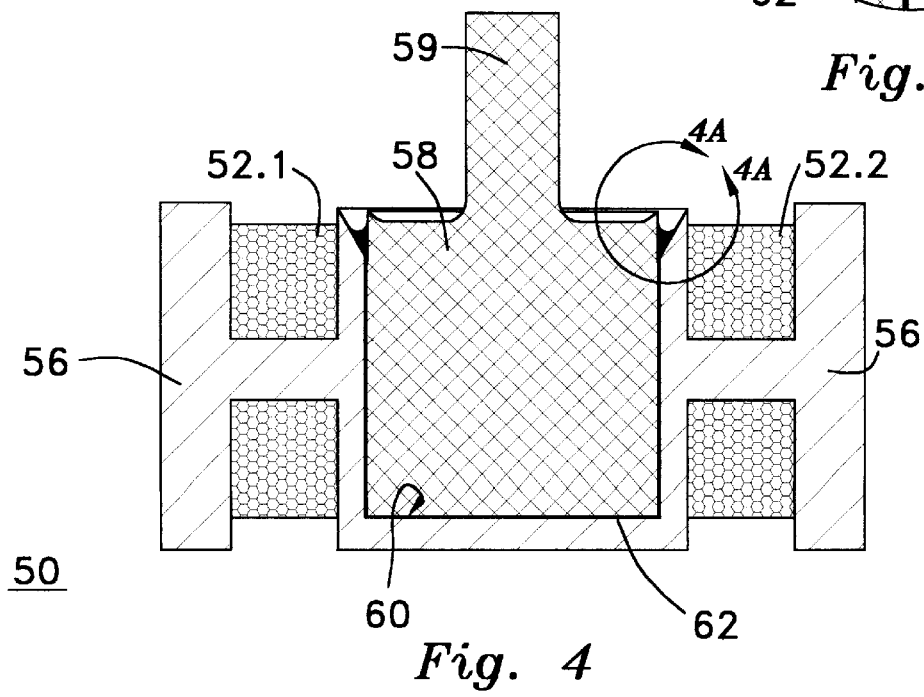
Fig. 4

FLUID THRUST BEARING FOR INDICATING INSTRUMENTS AND THE LIKE

BACKGROUND OF THE INVENTION

The present invention relates to a fluid thrust bearing apparatus wherein a rotatable element is prevented from moving axially out of a close-fitting cavity by cohesive and adhesive forces of a liquid disposed between the rotatable element and the cavity walls and negative (vacuum) pressure created when the rotatable element is axially stressed.

1. Field of the Invention

The present invention relates to the field of thrust bearings used to prevent axial movement of a shaft disposed in a cavity.

2. Description of Related Art

Most indicating instruments (e.g., ammeters, Bourdon tube pressure gauges, etc.) include a shaft, which rotates between radial and thrust bearings. The radial and thrust bearings prevent radial and axial movement of the shaft. The shaft is connected to a pointer that is juxtaposed against a dial, and the amount of shaft rotation correlates to the value of the parameter being measured (e.g., electrical current, pressure, etc.). In this way, the pointer indicates on the dial the value of the parameter.

Most indicating instruments are inexpensive. It is therefore critical that the number of parts are kept to a minimum. Further, it is preferred that manufacturing procedures are simplified to minimize labor costs. The elimination of even a single thrust bearing can provide a significant advantage to indicating instrument manufacturers.

The mechanism employed to create shaft rotation in a particular indicating instrument depends on the parameter being measured. For example, moving-magnet indicating instruments are well known for measuring electrical current. A movingmagnet indicating instrument of the cross-coil type is described in U.S. Pat. No. 5,095,266, which was issued to Yukio Ohike, et al. on Mar. 10, 1992. That patent discloses a pair of mutually perpendicular coils surrounding a magnetized rotor. The rotor is disposed in a cavity and connected to a shaft and associated pointer. Currents that vary with the momentary magnitude of the parameter being measured flow through the coils creating a correspondingly varying magnetic field. The magnetic field created by the current causes proportional rotation by the rotor and, in turn, the shaft and pointer.

By contrast, a "Bourdon tube" apparatus can be used to measure pressure. A Bourdon tube is a curved tube that is closed on one end and connected at its open end to the pressurized cavity to be analyzed. Pressure in the cavity deforms the tube, and the deformation of the tube is mechanically translated into rotation of a gear shaft. The gear shaft is coupled to a pointer, which indicates the measured pressure on a dial.

Most indicating instruments are characterized by low inertia and low friction, thus necessitating damping means. Typically, damping is provided by fluid, such as silicone oil, disposed between the rotating shaft or rotor and the walls of the cavity in which it sits. Unfortunately, most suitable damping fluids tend to migrate through the clearance between the pointer shaft and the instrument housing. This can cause the damping fluid to escape the instrument entirely or migrate into areas of the instrument where it is not desired, such as the pointer, the dial face, or the lens of the instrument. Applicant's U.S. patent application Ser. No. 09/146,741, filed Sep. 3, 1998, which is herein incorporated by reference, describes preferred "migration barriers" that can be used to prevent unwanted migration of damping fluid.

Another common characteristic of electrical and mechanical indicating instruments is that the shaft connected to the pointer must be prevented from moving axially. In most indicating instruments, axial movement is prevented by two physical thrust bearings--mechanical barriers to axial movement of the shaft in either direction. Alternatively, some prior art instruments discourage axial movement magnetically. For example, U.S. Pat. No. 4,710,706, which issued to Robert Krupa on Dec. 1, 1987; U.S. Pat. No. 3,013,210, which issued to Peter Wargo on Dec. 12, 1961; and U.S. Pat. No. 2,867,768, which issued to Austin E. Fibrance, et al., on Jan. 19, 1953, describe the use of a holding magnet to hold a magnetized shaft or rotor against a single thrust bearing, thereby preventing axial movement.

The holding magnets disclosed in these patents also bias control the magnetized shaft and return the pointer to the zero position after electrical input to the measuring device is cut off. This combination of a magnetic thrust bearing and a return-to-zero mechanism reduces the number of necessary parts for the instrument. However, a holding magnet is an inappropriate return-to-zero mechanism for some indicating instruments. For example, the shaft used in a mechanical indicating instrument, such as a Bourdon tube pressure gauge, is usually not magnetized and cannot be controlled with a magnet. Moreover, a variety of other return-to-zero mechanisms (e.g., hairsprings) are available that may be advantageous in certain applications.

What is needed is an apparatus for preventing axial movement of a rotatable element that reduces the number of necessary parts, e.g., by eliminating the need for a holding magnet or one of the two separate mechanical thrust bearings employed in the prior art.

What is needed is a thrust bearing that damps rotational movement of a rotatable element while also preventing axial movement.

What is needed is an apparatus for preventing axial movement of a rotatable element that can be employed in any indicating instrument, including electrical and mechanical indicating instruments.

What is needed is an apparatus for preventing axial movement of a rotatable element that can be employed in an indicating instrument with any return-to-zero mechanism.

SUMMARY OF THE INVENTION

The present invention provides a novel fluid thrust bearing by utilizing the cohesive and adhesive forces of fluid on a shaft in a close-fitting cavity. When used in an indicating instrument, the fluid thrust bearing of the present invention eliminates the need for a holding magnet or one of the two physical thrust bearings of the prior art. In addition, the fluid thrust bearing of the present invention damps rotational movement of the rotatable element while also preventing axial movement. Thus, in applications such as indicating instruments, where cost and ease of manufacture are critical, the present invention permits a reduction in parts and simplified assembly over prior art.

In accordance with one embodiment of the present invention, a rotatable element is disposed in a close-fitting cavity having an open end and a closed end. The closed end of the cavity provides a mechanical thrust bearing to prevent axial movement in one direction. Axial movement towards the open end of the cavity is prevented by disposing a fluid in a small gap between the rotatable element and the walls of the close-fitting cavity. The rotatable element is axially restrained from moving out of the cavity by (1) adhesion forces between and among the rotatable element, the liquid, and the walls of the cavity and (2) negative (vacuum) pressure created by the substantial exclusion of air in the cavity. This novel arrangement provides a reliable, low-cost thrust bearing apparatus employing fewer parts and providing for easier assembly than prior art arrangements.

In accordance with the present invention, the gap between the rotatable element and its associated cavity walls is so small that when the gap is filled with a viscous fluid the rotatable element is maintained in the cavity by molecular adhesion of the fluid to the rotatable element and cavity surfaces, and cohesive forces within the fluid. In addition, if a moderate axial separating force is applied between the rotatable element and the cavity walls, resultant tensile stress of the fluid causes a slight stretching of the fluid and negative (vacuum) pressure, tending to maintain the axial position of the rotatable element in the cavity and eliminating the need for one thrust bearing.

In accordance with a preferred feature of the present invention, a reservoir is located at the open end of the gap between the rotatable element and the cavity wall to allow for slight variations in the quantity of fluid deposited in the cavity, manufacturing tolerances of the rotatable element and cavity, and variations in the fluid volume due to temperature change. The reservoir is effected near the open end of the cavity by gradually increasing the size of the gap between the rotatable element and the cavity wall. Fluid is held in the reservoir by surface tension and is preferably prevented from spreading away from the reservoir area by migration barriers.

As used herein, the term "rotatable element" includes a shaft, a rotor, a shaft that is concentric with and coupled to a rotor, a shaft that is integral with a rotor, a disc, or any other rotatable element. In addition, the term "housing" includes any structure defining a cavity, including bobbins on which coils for indicating instruments are wound. Further, the term "cavity" as used herein includes a bore, a space defined by a bobbin or housing, or any definable space.

The fluid thrust bearing of the present invention can be employed in any type of indicating instrument, including electrical and mechanical indicating instruments. For example, in one preferred embodiment of the present invention, a fluid thrust bearing is employed in a moving magnet indicating instrument. A magnetized rotor is coupled to a pointer shaft and is disposed in a close-fitting cavity having an open end and a closed end. Fluid is disposed between the rotor and the walls of the close-fitting cavity. A pair of mutually perpendicular coils surround the rotor and carry electrical currents proportional to a parameter being measured by the instrument. The currents running through the surrounding coils create a magnetic field that causes the rotor to rotate an amount proportional to the parameter. The fluid disposed between the rotor and the cavity walls damps the rotation of the rotor and provides a fluid thrust bearing, preventing axial movement of the rotor towards the open end of the cavity.

In another preferred embodiment of the present invention, a fluid thrust bearing is employed in a mechanical indicating device, such as a Bourdon tube pressure gauge. In this embodiment, a shaft connected to a pointer is mechanically urged to rotate an amount proportional to the parameter being measured. The shaft is disposed in a close-fitting bore having an open end and a closed end, with fluid provided between the shaft and the bore. The fluid damps the rotation of the shaft and provides a fluid thrust bearing, preventing axial movement of the shaft towards the open end of the bore.

In another embodiment of the present invention, a fluid thrust bearing is provided for a rotatable element which rotates around a spindle. A bobbin or housing defines a first cavity having a closed end and an open end and adapted to receive a rotatable element. A spindle, which is integral with or connected to the housing, projects from the closed end into the first cavity. A rotatable element is provided having a second cavity that is concentric with the axis of rotation of the rotatable element. The second cavity is adapted to receive the spindle in a close-fitting arrangement so as to define a small gap between them and allow the rotatable element to rotate on the spindle. Fluid disposed in the gap between the spindle and the walls of the second cavity damps the rotational movement of the rotational element and prevents axial movement of the rotational element away from the spindle.

In another embodiment of the present invention, a housing defines a substantially conical cavity having two open ends. A rotational element is provided that is substantially conical in shape, closely matching the shape of the cavity, but defining a small gap there between. Fluid is disposed in the gap between the rotatable element and the cavity wall, thereby damping the rotational movement of the rotatable element and preventing axial movement out of the larger end of the conical cavity.

In yet another embodiment of the present invention, a fluid is disposed between a rotatable disk and a flat surface. The disk rotates on a shaft that is attached to the disk and projects through the disk at its axis of rotation into a close-fitting cavity in the flat surface. The fluid damps the rotation of the disk and prevents separation of the disk from the flat surface.

In another embodiment of the present invention, a fluid thrust bearing is created through a novel manufacturing process. A predetermined amount of fluid is disposed in a cavity. A rotatable element adapted to fit closely into the cavity is inserted, thereby defining a small gap between the rotatable element and the cavity wall. The rotatable element forces the fluid to fill the gap to the substantial exclusion of air thereby creating a fluid thrust bearing preventing axial movement of the rotatable element out of the cavity.

Accordingly, it is an object of the present invention to provide a fluid thrust bearing that can be used to prevent axial movement of a rotatable element in an indicating instrument that eliminates the need for a holding magnet or one of the two separate mechanical thrust bearings employed in prior art arrangements.

It is a further object of the present invention to provide a thrust bearing that prevents axial movement while also damping rotational movement of a rotatable element.

It is a further object of the present invention to provide an apparatus for preventing axial movement of a rotatable element that can be employed in any indicating instrument, including electrical and mechanical indicating instruments.

It is yet a further object of the present invention to provide a fluid thrust bearing that prevents axial movement of a rotatable element and can be employed in an indicating instrument with any return-to-zero mechanism.

For a fuller understanding of the nature and objects of the present invention, reference should be made to the following detailed description, taken in connection with the accompanying drawings.

BRIEF DESCRIPTION OF THE DRAWINGS

FIG. 1 is a schematic partial cross-sectional view of a moving magnet indicating instrument of a preferred embodiment of the present invention;

FIG. 1A is an enlarged view of a part of FIG. 1;

FIG. 2 is a cross-sectional view of the instrument of the present invention shown in FIG. 1, taken on plane 2—2 of FIG. 1;

FIG. 3 is a plan view of a moving magnet indicating instrument of another preferred embodiment of the present invention;

FIG. 4 is a partial cross-sectional view of the indicating instrument of the present invention shown in FIG. 3, taken on plane 4—4 of FIG. 3;

FIG. 4A is an enlarged view of a part of FIG. 4;

DESCRIPTION OF THE PREFERRED EMBODIMENTS

Figure 5:
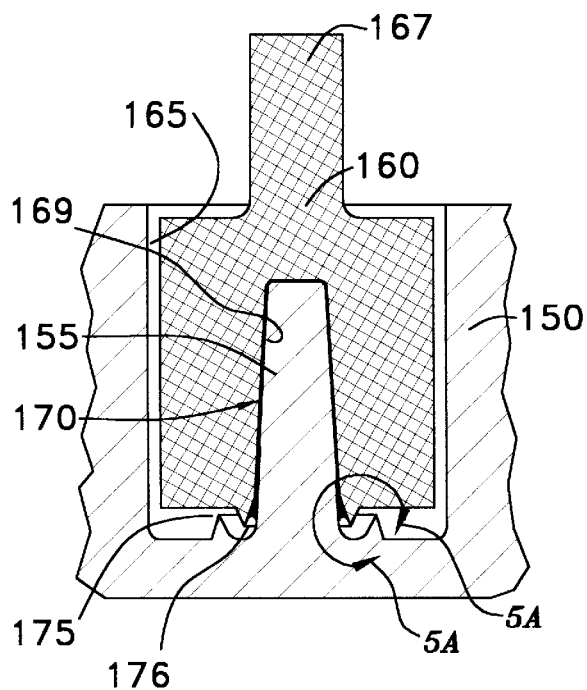
FIG. 5 is a partial cross-sectional view of the moving magnet indicating instrument of another preferred embodiment of the present invention.

The present invention provides a novel fluid thrust-bearing system and a method for assembling the same. When used in an indicating instrument, the fluid thrust bearing of the present invention reduces the number of necessary parts and simplifies assembly when compared to prior art. In general, a rotatable element is disposed in a close-fitting cavity so as to define as small gap between the element and the cavity walls, and a fluid is disposed in that gap to the substantial exclusion of air. The fluid damps the rotational movement of the element and maintains the element in the cavity by discouraging axial movement out of the cavity.

FIG. 1 is a cross-sectional schematic representation of a moving magnet indicating instrument 10 according to a preferred embodiment of the present invention. Indicating instrument 10 is comprised of a bobbin 12, which constitutes the body of indicating instrument 10. Indicating instrument 10 is further comprised of a transparent lens 14 through which a pointer 16 and a dial 18 can be viewed. Pointer 16 is mounted on the end of a pointer shaft 20.

As will be evident to those having ordinary skill in the art, only a part of bobbin 12 is shown in FIG. 1. A more extensive showing of a moving magnetic indicating instrument bobbin is found in FIG. 2 of the present drawings, and in Applicant's copending U.S. patent application Ser. No. 08/770,562, filed Dec. 20, 1996, and now U.S. Pat. No. 5,854,552.

As is most clearly seen with reference to FIG. 2, which is a cross-sectional view of indicating instrument 10 along line 2—2 of FIG. 1, indicating instrument 10 is further comprised of two pairs of field coils 22.1 and 22.2, and 24.1 and 24.2. Coils 22.1, 22.2, 24.1 and 24.2 are wound on bobbin 12 in the manner generally indicated in the above-cited U.S. Pat. No. 5,095,266 of Ohike et al, which is herein incorporated by reference.

Referring again to FIG. 1, bobbin 12 defines a cavity 26, which takes the form of the surface of a solid of revolution, having the same axis of revolution 28 as pointer shaft 20. Also in accordance with the present invention a rotor 30 is received in cavity 26 in a close-fitting manner. Rotor 30 is of slightly lesser diameter than the diameter of cavity 26, and thus a very small gap 32 exists between the cylindrical and closed-end walls of cavity 26 and the cylindrical and lower faces of rotor 30. Rotor 30 is freely rotatable within cavity 26 about axis 28.

Rotor 30 is formed from permanent magnet material and is so magnetized that it manifests a pair of magnetic poles that are oppositely disposed with respect to axis 28. Thus, rotor 30 coacts with the electromagnetic field produced by the excitation of coils 22.1, 22.2, 24.1, and 24.2. The electromagnetic field created by the excitation of coils 22.1, 22.2, 24.1, and 24.2 correlates with the variable to be measured and indicated by the position of pointer 16 relative to dial 18.

A bore 34 is provided in rotor 30 which extends through the upper face thereof and into the body thereof. Pointer shaft 20 is tight-fittingly contained in bore 34, and secured therein by any suitable means, e.g., insert molding, pressing, or cementing. Alternatively, pointer shaft 20 is manufactured as an integral part of rotor 30. Pointer 16 is similarly affixed to the upper end of pointer shaft 20.

As will be discussed more fully with reference to FIGS. 15 and 16, a premeasured quantity of viscous fluid is deposited in cavity 26 before rotor 30 is placed therein. In the following assembly step, rotor 30 is placed in cavity 26 with the axis of rotor 30 disposed in an upward vertical direction. Capillary action, the weight of the rotor and, optionally, additional axial force cause the rotor 30 to displace the fluid as it settles into cavity 26. As the fluid is displaced, it wets the surfaces of rotor 30 and cavity 26. When rotor 30 has fully settled into cavity 26, a very thin film of fluid fills the gap 32 between rotor 30 and cavity 26, and substantially all air is purged from the gap.

Excess fluid flows into an annular reservoir 33 that is provided by raised ridges around the upper perimeter of rotor 30 and bobbin 12. As most clearly seen in FIG. 1A, reservoir 33 is defined by toroidal ridges 36, 38 of triangular cross-section, which are coaxial with pointer shaft axis 28.

As explained in Applicant's copending U.S. patent application Ser. No. 08/770,562, previously herein incorporated by reference, these ridges have sharp edges and serve as barriers to the migration of the fluid beyond the area of reservoir 33 onto the outer surfaces of bobbin 12 and rotor 30. It is preferred that all migration barriers illustrated for embodiments of the present invention be provided in accordance with Applicant's copending U.S. patent application Ser. No. 08/770,562.

The coaction of the thin film of viscous fluid and the surfaces defining cavity 26 and rotor 30 damps the response of rotor 30 to the applied, varying electromagnetic field produced by the varying current in coils 22.1, 22.2, 24.1, and 24.2. In addition, the presence of the viscous fluid in the gap 32 between rotor 30 and the walls of cavity 26 provides a strong force that retains rotor 30 in cavity 26, thus negating the need for a mechanical thrust bearing.

Specifically, when a separating axial force is applied to the rotor 30 and bobbin 12, the fluid in gap 32 is prevented from flowing parallel to axis 28 towards the closed end of the cavity 26. Such inward flow of the liquid is prevented by the cohesive force of the fluid and the adhesive forces between and among the fluid, rotor 30 and the walls of cavity 26. Further, the fluid provides a seal that prevents air from leaking into cavity 26. When a separating axial force is applied to the rotor 30 and bobbin 12, the resultant tensile stress on the fluid causes a slight "stretching" of the fluid, an increase in fluid volume, and negative pressure on the rotor 30. In other words, when axial force is applied to rotor 30, a vacuum pressure is created between the flat bottom of rotor 30 and the flat bottom of cavity 26, thereby preventing axial movement of rotor 30.

Thus, in the embodiment of the present invention shown in FIG. 1, the viscous fluid in gap 32 damps the rotational movement of pointer 16 and also prevents axial movement of rotor 30 and pointer shaft 20. Unlike prior art systems employing a holding magnet, the fluid thrust bearing of the present invention reduces the necessary parts in any indicating instrument without requiring use of a particular return-to-zero mechanism. For example, as will be recognized by those skilled in the art, a variety of return-to zero mechanisms could be used in the indicating instrument illustrated in FIGS. 1–2, including a hair spring or radial magnets.

It is preferred that the surfaces of cavity 26 and rotor 30 be cleaned before assembly. Any particles on the surfaces will encourage entrapment of air. If air is entrapped in gap 32, the "seal" created between the walls of cavity 26 and rotor 30 by the fluid will be more easily broken, significantly diminishing the negative pressure on rotor 30 and severely decreasing the thrust bearing strength of the present invention.

It will be recognized by those skilled in the art that no thrust bearing, mechanical or otherwise, can completely "prevent" axial movement. Rather, a thrust bearing provides a barrier to movement that is effective against a certain maximum axial force. It will be appreciated, therefore, that references to "prevention" of axial movement herein denote a barrier to axial movement effective against a certain maximum of axial force.

The effectiveness of the fluid thrust bearing of the present invention varies depending on several factors including: the size and weight of the rotatable element, the fluid employed, the size of the gap, and ambient conditions.

In addition, with respect to all embodiments of the present invention, preferable viscous fluids include polydimethylsiloxane (dimethyl silicone fluid), perfluoropolyether (fluorinated lubricant), and perfluoroalkylether (fluorinated lubricant), although almost any fluid will provide some level of damping and thrust bearing. For optimum thrust bearing performance, however, it is desired that the fluid employed exhibit the following properties: low viscosity variation with temperature change, wide operating temperature range, thermal stability, chemical inertness, low compressibility, shear stability, low volatility (low vapor pressure), low flammability, and low surface tension. In general, "vacuum grade" fluids that have been degassed and possess a viscosity around 8,000 cps are preferred as they provide a suitable level of thrust bearing.

Further, it is preferred that the gap between cavity 26 and rotor 30 be very small. For example, where a rotor 30 having a diameter of 0.094" is employed, a gap of 0.001" has been found to be effective when using a damping fluid.

FIG. 3 shows a plan view of indicating instrument 50 using radial field coils in accordance with another preferred embodiment of the present invention. Indicating instrument 50 is comprised of instrument body 56, and a permanent magnet rotor 58, having an integral shaft 59. Instrument body 56 is a unitary member, preferably formed from a suitable plastic material, or a plurality of members formed from plastic material which may be interconnected to form instrument body 56. Radial coils 52.1, 52.2, 54.1, 54.2 are wound around instrument body 56. Although not depicted, it is understood by those skilled in the art that the embodiment shown in FIG. 3 can be employed with a pointer, dial, and lens as shown in FIG. 1.

Referring now to FIG. 4, there is shown a cross-sectional view of indicating instrument 50 along line 4—4 of FIG. 3. A cavity 60 is provided in instrument body 56. In accordance with the present invention, rotor 58 is close-fittingly received in cavity 60 to define therebetween a gap 62, comparable to gap 32 shown in FIG. 1. Rotor 58, like rotor 30 shown in FIG. 1, is formed from permanently magnetized material and coacts with the electromagnetic field produced by the excitation of field coils 52.1, 52.2, 54.1 and 54.2. Unlike the embodiment shown in FIG. 1, however, in this preferred embodiment, pointer shaft 59 is integral with rotor 58. In addition, as will be understood by those having ordinary skill in the art, a pointer (not shown) may be affixed to the upper end of integral pointer shaft 59 to indicate the value of the parameter being measured by instrument 50.

In the manner previously described with relation to FIG. 1, a viscous fluid 68 is disposed in gap 62. As discussed, the presence of a viscous fluid to the exclusion of air in gap 62 damps the rotational movement of rotor 58 and prevents axial movement of rotor 58 out of cavity 60. The dual function of fluid 68 makes it unnecessary to provide a separate mechanical thrust bearing at the open end of cavity 60.

FIG. 4A shows an enlarged view of the upper end of gap 62. The upper end of gap 62 terminates in a channel 64, which is defined by the upper end 61 of the outer cylindrical surface of rotor 58 and a chamfered portion 66 of the cylindrical wall of housing 56 defining cavity 60. Alternatively, channel 64 may be defined by chamfering the upper end 60 of the outer cylindrical surface of rotor 58. Toroidal ridges 61 and 66 also serve as migration barriers to prevent the migration of fluid 68 out of channel 64 as previously described.

A portion of the viscous fluid 68 that completely fills gap 62 extends into channel 64 and is held in place by the surface tension of fluid 68 and adhesion forces between fluid 68 and the surfaces of rotor 58 and chamfered portion 66 of the cylindrical wall of cavity 60. Channel 64 is provided to compensate for changes in fluid volume due to fluctuating temperature, and tolerances in the manufacture of cavity 60 and rotor 58 and in the measurement of fluid 68 disposed in cavity 60.

FIGS. 5–8 illustrate another embodiment of the present invention utilizing a rotatable element adapted to rotate on a spindle. The use of a spindle arrangement is helpful in applications where very little damping is required. The damping surface between the spindle and rotatable element is smaller, thus minimizing the damping effect of the fluid disposed between them.

Referring to FIG. 5, housing 150 defines a cavity 165 into which a magnetized rotor 160 fits loosely. Housing 150 is also molded, however, to include a conical spindle 155, that projects into cavity 165. Rotor 160 includes an integral shaft 167, which is concentric with spindle 155 and extends out of cavity 165. Rotor 160 is also adapted to provide a cavity 169, which close-fittingly receives spindle 155, thereby creating a small gap 170 between spindle 155 and the walls of cavity 169.

Viscous fluid is disposed in gap 170 as previously described. Migration barriers 175 and 176 are again provided as raised toroidal ridges on housing 150 and rotor 160, respectively. It will be recognized by those skilled in the art that the rotor and spindle arrangement depicted in FIG. 5 may be employed in, among others, the indicating instruments described with relation to FIGS. 1–4. When this arrangement is used in an indicating instrument, shaft 167 is connected to a pointer (not shown) and rotates in correlation with rotor 160, which is influenced by a magnetic field comparable to a parameter to be measured. Here again, in the manner previously described, the fluid provided in gap 170 damps the rotation of rotor 160 and prevents axial movement of rotor 160 out of cavity 165.

Figure 5A:
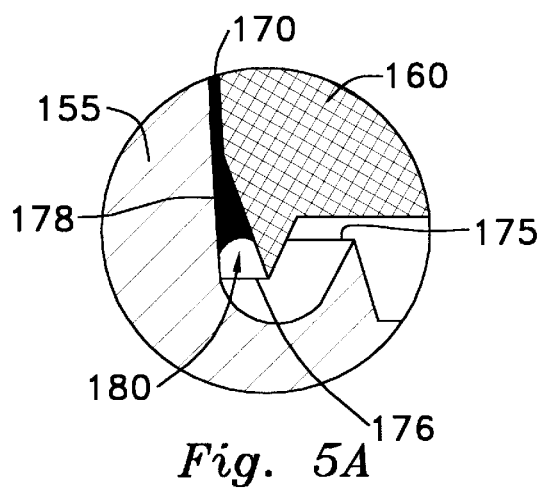
FIG. 5A is a partial cross-sectional view of a part of FIG. 5.

FIG. 5A provides a detailed view of a portion of FIG. 5. A channel 180 is provided near the open end of gap 170 to allow for the retention of excess fluid 178 from gap 170. Fluid 178 is prevented from running out of channel 180 by the surface tension of the fluid 178 and adhesion forces between fluid 178, rotor 160, and spindle 155. Channel 180 is created by the juxtaposition of spindle 155 and a chamfered portion of rotor 160. As explained, however, channel 180 can also be created by chamfering a portion of spindle 155 or chamfering both spindle 155 and rotor 160. It is preferred that the angle created by channel 180 be on the order of 30–45 degrees.

Figure 6:
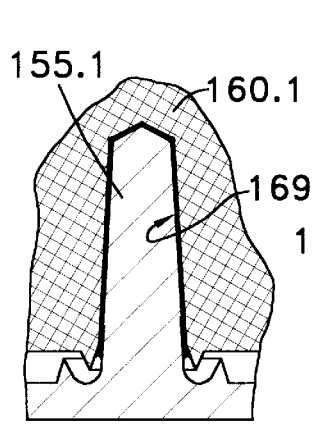
FIGS. 6, 7, and 8 are partial cross-sectional views of alternative spindle elements which may be substituted in the preferred embodiment of the present invention shown in FIG. 5.
Figure 7:
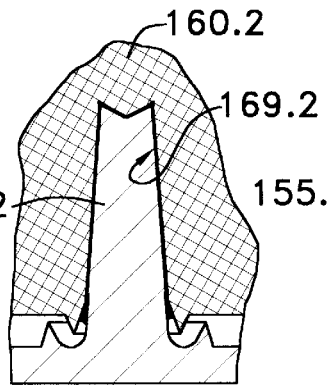
Figure 8:
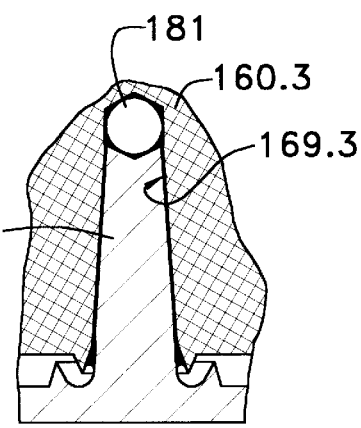

FIGS. 6–8 depict alternative spindle arrangements to the one shown in FIG. 5. In FIG. 6, spindle 155.1 terminates in a protruding conical point. Rotor 160.1 is adapted to provide a cavity 169.1 to close-fittingly receive the conical point of spindle 155.1. Alternatively, FIG. 7 illustrates an embodiment in which spindle 155.2 terminates in a concave depression. Rotor 160.2 is adapted to create a cavity 169.2 having a convex protrusion at its closed end that close-fittingly receives the spindle 155.2.

FIG. 8 illustrates an alternative embodiment in which spindle 155.3 terminates in a concave depression and is adapted to receive a metal ball 181. Rotor 160.3 is adapted to provide a cavity 169.3 that close-fittingly receives spindle 155.3 and ball 181 at the closed end of the cavity. This embodiment is preferred in applications where, during assembly, significant force is expected to be used to mount rotor 160.3 on spindle 155.3. In most applications, spindle 155.3 is comprised of plastic. If excess force is applied while mounting rotor 160.3 on spindle 155.3, it is expected that any deformation of spindle 155.3 occurs between spindle 155.3 and metal ball 181. This technique avoids deformation of the surface on which rotor 160.3 must rotate. Although steel is preferred, ball 185 may be comprised of any material that does not deform under pressure from rotor 160.3.

Figure 9:
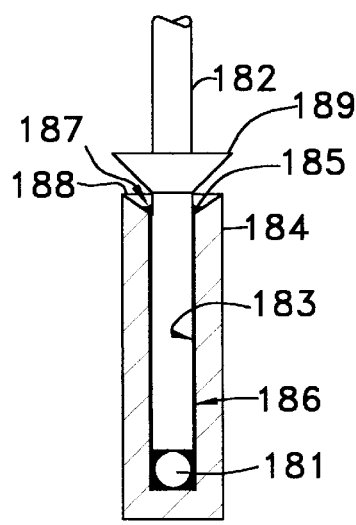
FIG. 9 is a partial axial cross-sectional view of a fluid thrust bearing of another preferred embodiment of the present invention.
Figure 10:
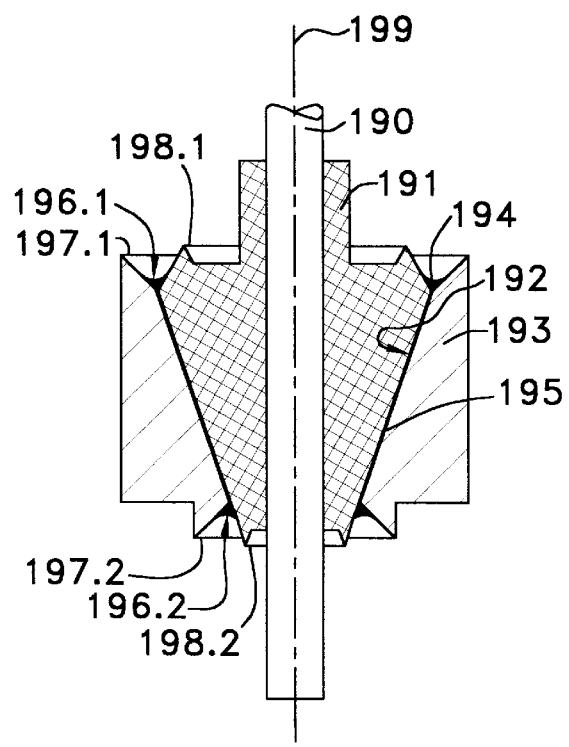
FIG. 10 is a partial cross-sectional view of a fluid thrust bearing of another preferred embodiment of the present invention.
Figure 11:
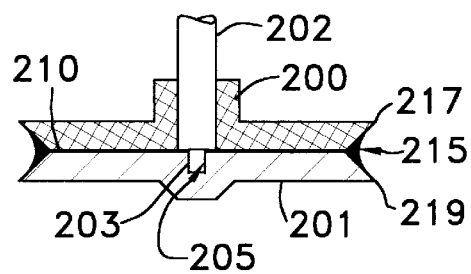
FIG. 11 is a partial cross-sectional view of a fluid thrust bearing of another preferred embodiment of the present invention.

FIGS. 9–11 depict alternative arrangements employing the novel fluid thrust bearing of the present invention. In each depicted embodiment, a rotatable element is discouraged from moving axially. FIG. 9 depicts a shaft 182 disposed in a bore 183, defined by housing 184. Optionally, as described with respect to FIG. 8, a metal ball 181 is disposed at the enclosed end of bore 183. Fluid 185 is provided in gap 186, which is defined by the surfaces of shaft 182, ball 181 and bore 183. Fluid 185 fills gap 186 to the substantial exclusion of air in gap 186. Excess fluid 185 is retained in channel 187, which is created by chamfered portion 188 of housing 184. Optionally, shaft 182 is provided an annular sleeve with a triangular cross-section 189 as a migration barrier.

In the embodiment shown in FIG. 10, shaft 190 extends in two directions through a concentric, attached rotor 191. This embodiment may be used in applications requiring a dual-faced indicating instrument, having two dials and two pointers indicating readings on either side of the instrument. Rotor 191 is disposed in a close-fitting cavity 192 defined by housing 193. Cavity 192 is substantially conical in shape and housing 193 has two open ends. Fluid 194 is disposed in gap 195. Channels 196.1 and 196.2 are provided at both open ends of gap 195 to retain excess fluid 194. Channels 196.1 and 196.2 are defined by chamfered portions 197.1, 197.2, 198.1, and 198.2, of housing 193 and rotor 191, respectively.

The narrowing of cavity 192 prevents axial movement of rotor 191 towards the smaller end of cavity 192. Further, in accordance with the description of previous embodiments, fluid 194 disposed in gap 195 damps rotational movement of rotor 191 and discourages axial movement by shaft 190 and rotor 191 towards the wider end of cavity 192.

The fluid thrust bearing capabilities of this arrangement, however, are not as great as the closed-end embodiments illustrated in FIGS. 1–9. In the closed-end embodiments, negative pressure is created between the shaft or rotor and the surface perpendicular to its axis of rotation, i.e., the closed end of the cavity. Because there is no closed-end surface adjacent to the bottom face of rotor 191 and perpendicular to its axis of rotation 199, less negative pressure is created when an axial separating force is applied. In addition, with two open ends, air is more likely to enter gap 195 when a separating force is applied, thereby breaking the vacuum seal created by the fluid in gap 195. Nevertheless, the embodiment shown in FIG. 10 provides sufficient thrust bearing for many applications, including indicating instruments.

FIG. 11 depicts an alternative embodiment of the present invention wherein a rotatable element 200 is prevented from moving axially away from a flat disk housing 201. A shaft 202 and integral nubbin 203 are concentric with and attached to rotatable element 200. Nubbin 203 extends into a close fitting bore 205 defined by disk 201. Fluid is provided in the gap 210 between rotatable element 200 and disk 201 and between nubbin 203 and the walls of bore 205. In addition, each of rotatable element 200 and disk 201 include chamfered edges 217 and 219, respectively, defining a channel 215 that acts as a reservoir for excess fluid. In the manner previously described, the fluid in gap 210 damps the rotational movement of element 200 and discourages the axial separation of element 200 and disk 201.

Figure 12:
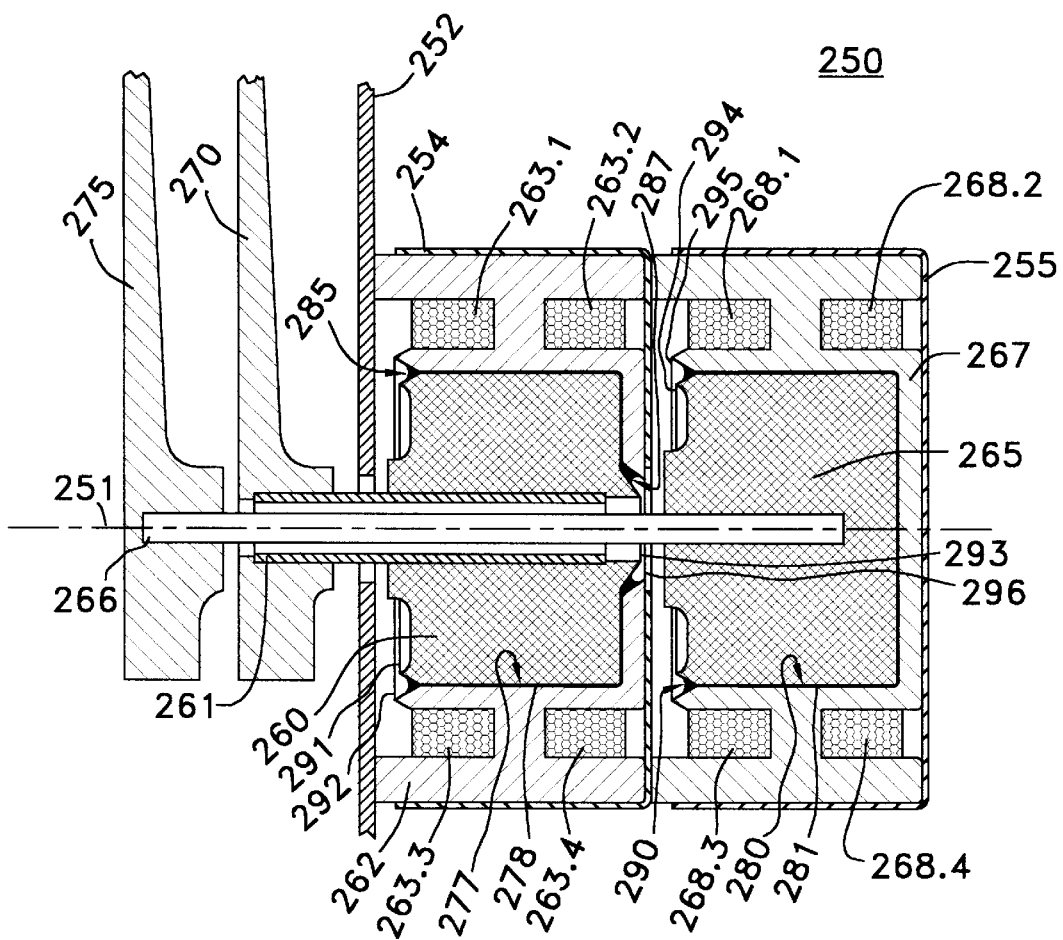
FIG. 12 is a partial cross-sectional view of a dual pointer moving magnet indicating instrument of another preferred embodiment of the present invention.

FIG. 12 is a cross-section of a dual pointer indicating instrument 250 according to another embodiment of the present invention. Dual pointer indicating instrument 250 can be used to indicate the value of two variables simultaneously. The value of the two variables is indicated by the juxtaposition of two pointers 270 and 275 against a dial 252.

Housings 254 and 255 enclose adjacent, concentric rotors 260 and 265 having a common axis of rotation 251. Bobbins 262 and 267 define cavities 277 and 280, which close-fittingly receive rotors 260 and 265, respectively. Cavity 277 has two open ends oppositely opposed to axis of rotation 251. Rotor 260 includes a tubular shaft 261 that extends beyond cavity 277 through dial 252 and connects to pointer 270. Shaft 266 is connected to rotor 265 and extends through a tubular passage in rotor 260 and integral tubular shaft 261 to connect to a second pointer 275. It is preferred that the tubular passage through rotor 260 provide a ample passage for shaft 266 such that it does not impede the rotation of shaft 266.

Fluid is disposed in each of the gaps 278 and 281 defined between rotors 260 and 265 and bobbins 262 and 267, respectively. As previously described, channels 285, 287 and 290 are provided at each openings of cavities 277 and 280 to retain any excess liquid in gaps 278 and 281. In addition, migration barriers 291-296 are provided as previously described herein to prevent the migration of fluid out of channels 285, 287, and 290.

Each rotor 260 and 265 is provided with separate sets of coils 263.1–263.4 and 268.1–268.4, respectively. Separate electrical inputs correlating to two parameters to be measured are fed to coils 263.1–263.4 and 268.1–268.4. In this manner, pointers 270 and 275 indicate the value of two different perimeters simultaneously when juxtaposed against dial 252. In addition, as previously described, the fluid thrust bearing of the present invention permits each rotor 260 and 265 to be rotationally damped and prevented from moving axially out of cavities 277 and 280, respectively.

Figure 13:
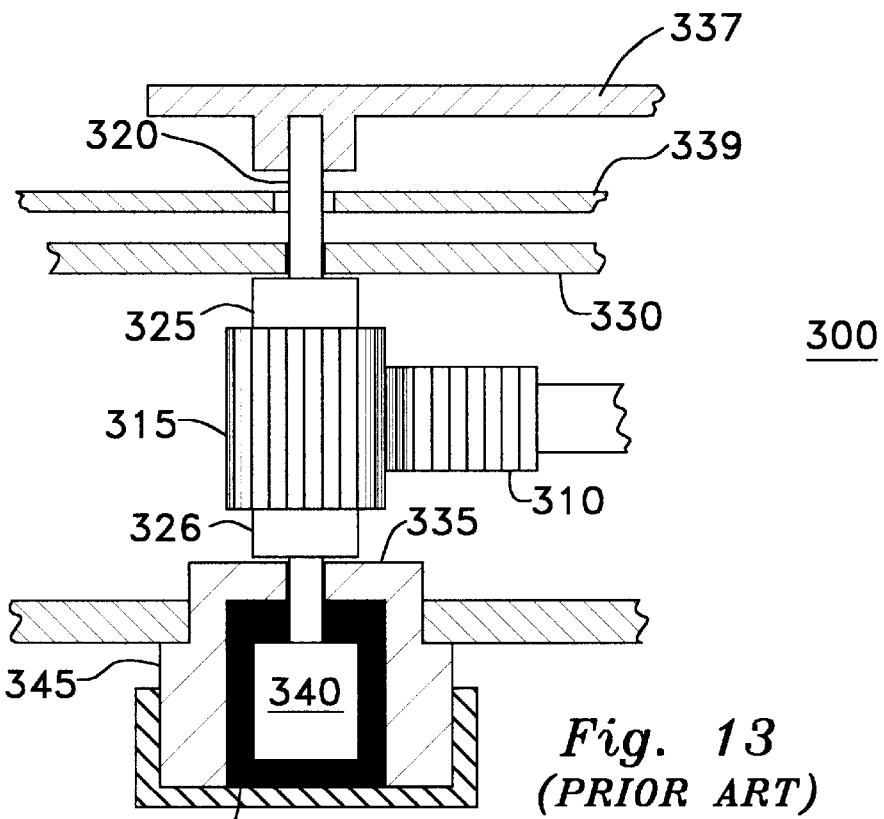
FIG. 13 is a partial cross-sectional view of a Bourdon tube pressure gauge of the prior art.

The fluid thrust bearing of the present invention can also be employed in mechanical indicating instruments. For example, it can be used with a Bourdon tube pressure gauge. A Bourdon tube is a hollow, curved tube with one closed end and one open end. The open end connects to a pressurized cavity. The pressure in the cavity causes the curved tube to straighten an amount proportional to the pressure. FIG. 13 illustrates a prior art Bourdon tube pressure gauge 300.

Sector gear 310 is coupled to the Bourdon tube (not shown) such that sector gear 310 moves an amount proportional to the deformation of the Bourdon tube, which, itself, is proportional to the pressure in the cavity being tested. Sector gear 310 engages pinion 315, which is coupled to a shaft 320 and associated sleeves 325 and 326. In the manner previously described, shaft 320 is connected to a pointer 337, which is juxtaposed against a dial 339 to indicate the pressure in the cavity being tested.

This prior art arrangement requires two mechanical thrust bearings 330 and 335, operating in conjunction with sleeves 325 and 326, to prohibit the axial movement of pinion 315. Shaft 320 is connected to a rotatable element 340, which is loosely received by a cavity defined by lower housing 345. The cavity is filled with a viscous fluid 350, which damps the rotational movement of rotational element 340 and, in turn, shaft 320 and pinion 315.

Figure 14:
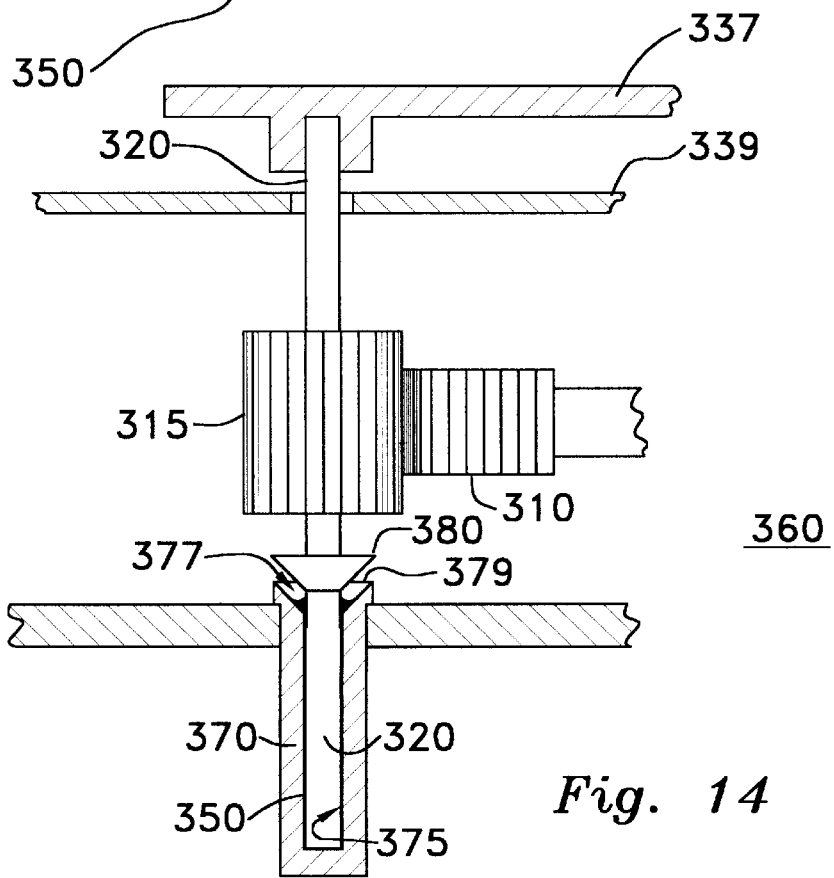
FIG. 14 is a partial cross-sectional view of a Bourdon tube pressure gauge of another preferred embodiment of the present invention.

The prior art arrangement shown in FIG. 13 suffers from two main flaws: (1) it requires too many parts and (2) fluid 350 tends to leak out of the cavity defined by lower housing 345 and migrates to undesired areas of the instrument. The Bourdon tube pressure gauge of the present invention 360 shown in FIG. 14 overcomes those flaws by eliminating parts and decreasing fluid migration.

Sector gear 310 and pinion 315 cooperate in the manner described above to rotate shaft 320 and pointer 337 and to indicate the measured pressure on dial 339. Unlike in the prior art, however, the shaft 320 extends into a close-fitting bore defined by housing 370. The gap 375 between shaft 320 and housing 370 is filled with fluid 350 to the substantial exclusion of air in gap 375. As previously described, gap 375 preferably terminates in a channel 377 that acts as a reservoir for excess fluid 350. Channel 377 is preferably created via a chamfered portion 379 of housing 370. Optionally, a migration barrier sleeve 380 may also be provided on shaft 320 as previously described with relation to FIG. 9.

In accordance with the present invention, the adhesive and cohesive forces of fluid 350 tend to maintain the axial position of shaft 320. In addition, due to the substantial exclusion of air in gap 375, negative pressure is created when axial force is applied to shaft 320, further preventing axial movement of shaft 320 out of housing 370. The fluid thrust bearing capability of this arrangement permits the elimination of sleeves 325 and 326 and mechanical thrust bearing 330.

Further, the Bourdon tube pressure gauge utilizing the present invention reduces unwanted migration of fluid 350. The apparatus of the present invention shown in FIG. 14 requires less fluid than the prior art, so there is less fluid that has the possibility of migrating. Further, the close-fitting arrangement between shaft 320 and housing 370 discourages migration, and chamfered portion 379 of housing 370 and sleeve 380 act as migration barriers. Accordingly, the present invention, as employed in the Bourdon tube pressure gauge depicted in FIG. 14, eliminates parts and decreases fluid leakage when compared to prior art instruments.

Figure 15A:
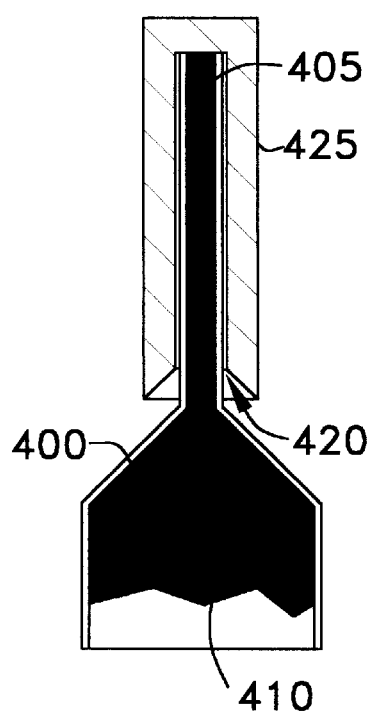
FIGS. 15A–E are partial cross-sectional views of assembly steps for a preferred method of assembling a fluid thrust bearing of the present invention using a long, small diameter bore.

Because the present invention utilizes fewer parts than prior art systems, assembly is simplified. FIGS. 15A–E illustrate the preferred method of assembly for applications using long, small-diameter bores and shafts. As shown in FIG. 15A, the tubular dispensing end 405 of a fluid metering device 400 is inserted to the closed end of bore 420 defined by housing 425. The outer diameter of tube 405 is preferably only slightly smaller than the inner-diameter of bore 420. Metering device 400 should be capable of accurately dispensing a predetermined quantity of fluid 410. Suitable fluid metering devices are made by, among others, EFD, of East Providence, Rhode Island, and Tridak Division of Indicon, Inc., of Brookfield, Conn. It is preferred that the dispensing tube 405 of metering device 400 press lightly against the closed end of bore 420. This helps to keep air from being trapped in fluid 410 during dispensing and may be accomplished by either the force of gravity or with a weak spring.

Figure 15B:
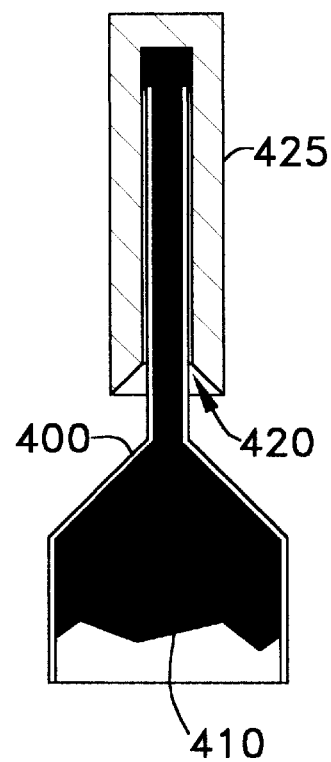

As shown in FIG. 15B, metering device 400 dispenses fluid 410 into the closed end of bore 420. If, as preferred, fluid 410 comprises a viscous fluid, it will not immediately flow out of bore 420 even if bore 420 is disposed with its open end down as shown in FIG. 15B. Alternatively, fluid 410 can be dispensed into bore 420 with its closed end down so long as some force is applied to metering device 400 against the closed end of bore 420.

Figure 15C:
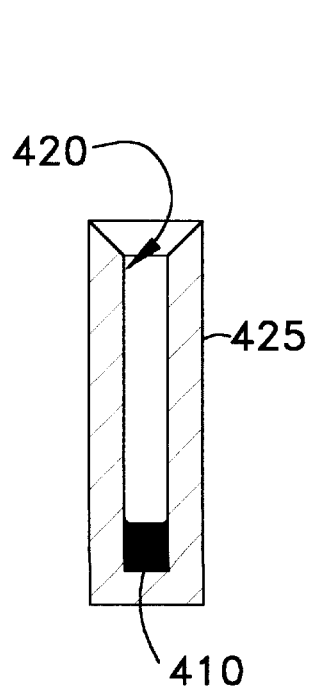

Before fluid 410 flows out, bore 420 is inverted to place its closed end down. Metering device 400 is then removed leaving a predetermined amount of fluid 410 in the bottom of bore 420 as shown in FIG. 15C. The amount of fluid dispensed into bore 420 varies depending on several factors, including: damping requirements, size of bore 420, size of shaft to be disposed in bore 420, the temperature at which an instrument using the present invention will be operating, size of reservoirs adapted to retain overflow fluid, etc.

Figure 15D:
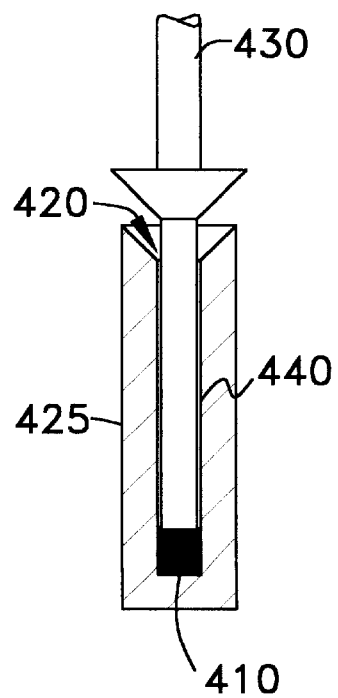
Figure 15E:
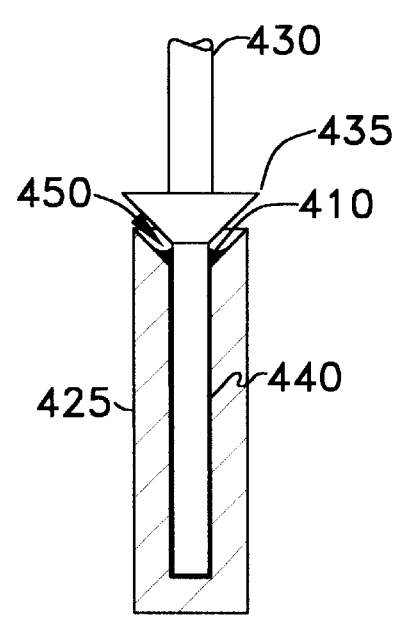

As shown in FIGS. 15D and 15E, a shaft 430 is then disposed in bore 420 to define a gap 440 between shaft 430 and the walls of bore 420. The weight of the shaft 430 and capillary action in the fluid 410 cause shaft 430 to move downward and fluid 410 to fill the gap 440. Optionally, light force is applied to the shaft 430 to ensure that shaft 430 reaches the bottom of bore 420.

It is important that substantially all air is pushed out of gap 440 by fluid 410. Air bubbles in gap 440 will substantially weaken the thrust bearing capabilities of this arrangement. To minimize entrapment of air, it is preferred that shaft 430 and the walls of bore 420 be cleansed of all particles that may cause air bubbles. Further, shaft 430 should not be treated with fluid before being disposed in bore 420 as the fluid seal between shaft 430 and the walls of bore 420 will trap air in gap 440 as shaft 430 moves down bore 420.

Further, it is preferred that a small amount of fluid 410 overflows gap 440 into channel 450. Channel 450 is created as previously described, preferably via a chamfered portion of housing 425. In addition, it is preferred that a migration barrier sleeve 435 is provided to prevent migration of fluid 410 up shaft 430.

It will be recognized by those skilled in the art that the assembly procedure shown in FIGS. 15A–E may be easily adapted to other applications involving long, small diameter cavities. For example, with respect to the embodiments shown in FIG. 5–8, each of which utilizes a spindle protruding into a cavity of a rotor, the fluid is dispensed in the cavity of the rotor, and the spindle is inserted therein as shown in FIGS. 15A–15E. In addition, in embodiments utilizing a metal ball such as in FIGS. 8 and 9, it is preferred that the ball is completed submersed in the fluid at the bottom of the cavity before the shaft or spindle is inserted into the cavity.

Figure 16A:
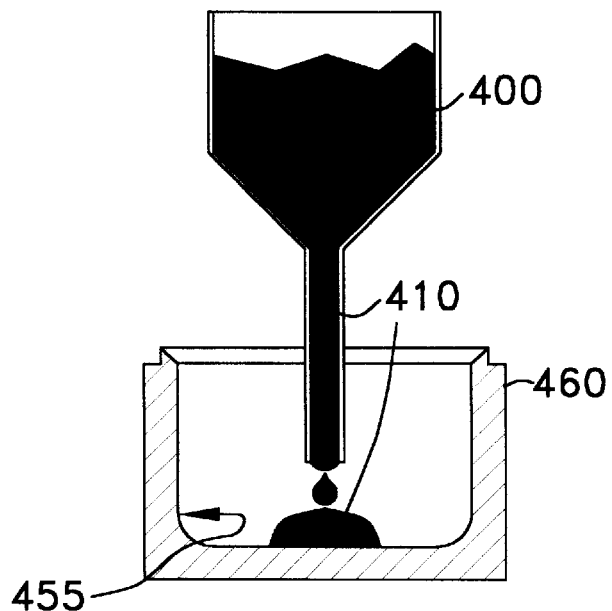
FIG. 16A–C are partial cross-sectional views of assembly steps for a preferred method of assembling a fluid thrust bearing of the present invention using a short, large-diameter cavity.
Figure 16B:
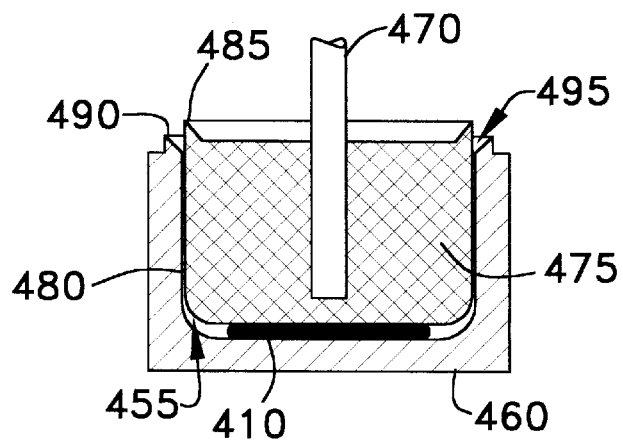
Figure 16C:
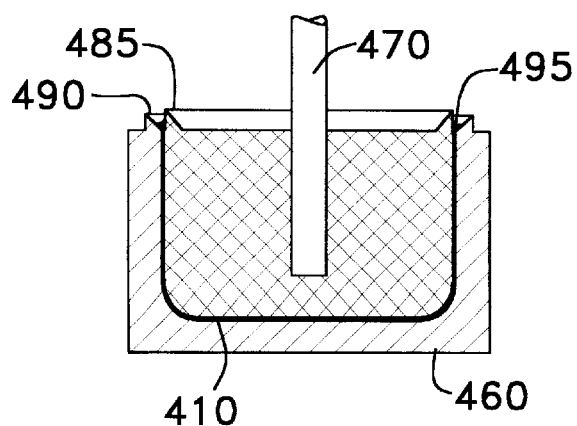

FIGS. 16A–C illustrate the preferred technique for creating a fluid thrust bearing for embodiments of the present invention utilizing short, large diameter cavities. Fluid metering device 400 dispenses a predetermined quantity of fluid 410 into a cavity 455 defined by a housing 460. Shaft 470, which is coupled to a larger rotatable element 475, such as a rotor, is inserted into cavity 455 thereby defining a gap 480. Gravity or, optionally, a light external force pushes rotatable element 475 down into cavity 455 and forces fluid 410 to fill gap 480. Again, it is preferred that enough fluid 410 is provided to create an overflow from gap 480 into channel 495. Channel 495 is created as previously described, and preferably by the juxtaposition of migration barriers 485 and 490, which are provided on rotatable element 475 and housing 460, respectively. Again, it is important that substantially all air is forced out of gap 480 by fluid 410, which can be accomplished via the procedures outlined above with respect to FIGS. 15A–E.

In embodiments involving a cavity having two open ends, such as in FIG. 10, it is preferred that the rotatable element is placed into the cavity dry. A predetermined amount of fluid is then disposed in the channel provided for fluid overflow. Slowly rotating the rotatable element will evenly dispense the fluid into the gap between the rotatable element and cavity walls by capillary action without the substantial entrapment of air.

It will be appreciated by one of ordinary skill in the art that the present invention can be employed in applications other than the preferred embodiments set forth herein. For example, although the present invention has been described with relation to certain indicating instruments, such as cross-coil moving magnet indicating instruments and Bourdon tube pressure gauges, those skilled in the art will recognize that the present invention can be adapted to accommodate any indicating instrument. In addition, it will be recognized that the fluid thrust bearing of the present invention can be employed in a variety of settings outside the indicating instrument art and can be used to prevent any shaft from moving axially out of a close-fitting cavity regardless whether the shaft is rotatable. Consequently, variations and modifications commensurate with the above teachings, and within the skill and knowledge of the relevant art, are part of the scope of the present invention. It is intended that the appended claims be construed to include alternative embodiments to the extent permitted by law.

I claim:

1. A thrust bearing system comprising:
   a rotatable element having a first-end surface, a second-end surface, and a main surface connecting the firs-end and second-end surfaces;
   a housing defining a cavity, the housing having a first end defining an opening to the cavity and a second end, the housing adapted to accept the rotatable element through the open first end, the rotatable element residing within the cavity in close-fitting arrangement with the housing, whereby a small gap is created between the housing and at least one of the first-end surface and main surface of the rotatable element; and
   a fluid, disposed in the cavity such that the fluid substantially fills the gap to the substantial exclusion of air in the gap such that the fluid substantially prevents the rotatable element from moving in an axial direction out of the cavity by cohesive and adhesive forces of the fluid on the rotatable element and by negative pressure created by the substantial exclusion of air from the gap.

2. The thrust bearing system of claim 1, wherein the fluid in the cavity damps the rotational movement of the rotatable element.

3. The thrust bearing system of claim 1, which further comprises:
   a shaft operatively connected to the second-end surface of rotatable element;
   a pointer, operatively connected to the shaft, spaced apart from the rotatable element; and
   a means for rotating the rotatable element, the shaft, and the pointer an amount proportional to a measurable variable.

4. The thrust bearing system of claim 3, wherein the means for rotating comprises a Bourdon tube operatively connected to the rotatable element.

5. The thrust bearing system of claim 3, wherein the rotatable element comprises a rotatable magnet, and the means for rotating further comprises electrical coils encompassing the housing and environing the rotatable magnet, the electrical coils connected to an electrical source that produces a variable electrical current, whereby the electrical coils create a magnetic field when excited by the electrical source, thereby causing the rotatable magnet, the shaft and the pointer to rotate an amount proportional to the variable current.

6. The thrust bearing system of claim 1, which further comprises a first migration barrier comprising a raised portion of the housing located at and along the perimeter of the first end of the housing defining the cavity and surrounding the perimeter of the second-end surface of the rotatable element.

7. The thrust bearing system of claim 6, which further comprises a second migration barrier comprising a raised portion of the rotatable element located along the perimeter of the second-end surface of the rotatable element in a plane substantially parallel to the second-end surface of the rotatable element.

8. The thrust bearing system of claim 7 wherein the first and second migration barriers are ridges having sharp peaks.

9. The thrust bearing system of claim 1, which further comprises a migration barrier comprising a raised portion of the rotatable element located along the perimeter of the second-end surface of the rotatable element in a plane substantially parallel to the second-end surface of the rotatable element.

* * * * *

UNITED STATES PATENT AND TRADEMARK OFFICE
CERTIFICATE OF CORRECTION

PATENT NO. : 6,190,049 B1
DATED : February 20, 2001
INVENTOR(S) : Vincent H. Rose It is certified that error appears in the above-identified patent and that said Letters Patent is hereby corrected as shown below:

Claim 1,
Line 3, delete "firs-end" and insert -- first-end --.

Signed and Sealed this

Sixth Day of November, 2001

Attest:

*Nicholas P. Godici*

NICHOLAS P. GODICI
*Attesting Officer*     *Acting Director of the United States Patent and Trademark Office*

UNITED STATES PATENT AND TRADEMARK OFFICE
CERTIFICATE OF CORRECTION

PATENT NO. : 6,190,049 B1
DATED : February 20, 2001
INVENTOR(S) : Vincent H. Rose It is certified that error appears in the above-identified patent and that said Letters Patent is hereby corrected as shown below:

Claim 1,
Line 3, delete "firs-end" and insert -- first-end -- .

Signed and Sealed this

Twentieth Day of November, 2001

Attest:

*Attesting Officer*

NICHOLAS P. GODICI
*Acting Director of the United States Patent and Trademark Office*